(12) United States Patent
Remillard et al.

(10) Patent No.: US 12,131,454 B2
(45) Date of Patent: Oct. 29, 2024

(54) SUBSTRATE MAPPING USING DEEP NEURAL-NETWORKS

(71) Applicant: Onto Innovation, Inc., Wilmington, MA (US)

(72) Inventors: Jason Paul Remillard, Groton, MA (US); John D. Nevin, IV, Andover, MN (US); Stephen W. Into, Harvard, MA (US)

(73) Assignee: Onto Innovation, Inc., Wilmington, MA (US)

( * ) Notice: Subject to any disclaimer, the term of this patent is extended or adjusted under 35 U.S.C. 154(b) by 380 days.

(21) Appl. No.: 17/476,195

(22) Filed: Sep. 15, 2021

(65) Prior Publication Data

US 2023/0085039 A1    Mar. 16, 2023

(51) Int. Cl.
*G06T 7/00* (2017.01)
*B25J 9/16* (2006.01)
(Continued)

(52) U.S. Cl.
CPC .......... *G06T 7/0004* (2013.01); *B25J 9/1697* (2013.01); *G06F 18/24* (2023.01);
(Continued)

(58) Field of Classification Search
CPC ......... H01L 21/67766; H01L 21/67769; H01L 21/67265; G06T 2207/20081;
(Continued)

(56) References Cited

U.S. PATENT DOCUMENTS 11,740,186 B2 * 8/2023 Woo ................. G01N 21/95607
382/141
2018/0150952 A1 5/2018 Sah et al.
(Continued)

FOREIGN PATENT DOCUMENTS

CN    207398069    5/2018
EP    3623882 A    3/2020
(Continued)

OTHER PUBLICATIONS

"International Application Serial No. PCT/US2022/076461, International Search Report mailed Jan. 9, 2023", 3 pgs.
(Continued)

*Primary Examiner* — Pinalben Patel
(74) *Attorney, Agent, or Firm* — Schwegman Lundberg & Woessner, P.A.

(57) ABSTRACT

Various examples include a system and network to map of substrates within a substrate carrier (e.g., such as silicon wafers within a wafer cassette), and a classification of a state of each substrate, as well as the carrier in which the substrates are placed. In various examples provided herein, an image acquisition system, such as a camera, acquires multiple images of the substrates within the carrier. The image or images are then processed with a deep-convolutional neural-network to classify a state of the substrate relative to a substrate slot including empty slots, occupied slots (e.g., properly loaded slots), double-loaded slots, cross-slotted, and protruded (where a substrate is not fully loaded into a slot).

20 Claims, 12 Drawing Sheets

(51) Int. Cl.
 *G06F 18/24* (2023.01)
 *H01L 21/677* (2006.01)
(52) U.S. Cl.
 CPC .. *H01L 21/67766* (2013.01); *H01L 21/67769* (2013.01); *G06T 2207/20081* (2013.01); *G06T 2207/20084* (2013.01)
(58) Field of Classification Search
 CPC ........... G06T 2207/10024; G06T 2207/30148; G01N 2021/8883; G01N 21/9501; G06V 10/32; G06V 10/82
 See application file for complete search history.

(56) References Cited

U.S. PATENT DOCUMENTS

| | | | | |
|---|---|---|---|---|
| 2018/0239022 | A1* | 8/2018 | Lee | ....................... G01S 7/4972 |
| 2019/0005357 | A1 | 1/2019 | Bhaviripudi et al. | |
| 2020/0089130 | A1* | 3/2020 | Chao | ....................... G06F 30/398 |
| 2021/0097226 | A1* | 4/2021 | Chao | ....................... G03F 7/7065 |

FOREIGN PATENT DOCUMENTS

| | | | |
|---|---|---|---|
| TW | I305395 | 1/2009 | |
| TW | M422747 | 2/2012 | |
| TW | 201814806 | 4/2018 | |
| TW | 202318263 | 5/2023 | |
| WO | WO-2022055657 A1 * | 3/2022 | ......... G01N 21/9501 |
| WO | 2023044367 | 3/2023 | |

OTHER PUBLICATIONS

"International Application Serial No. PCT/US2022/076461, Written Opinion mailed Jan. 9, 2023", 5 pgs.

"Taiwanese Application Serial No. 111134973, Office Action mailed Oct. 5, 2023", with English translation, 17 pages.

"International Application Serial No. PCT US2022 076461, International Preliminary Report on Patentability mailed Mar. 28, 2024", 7 pgs.

"Taiwanese Application Serial No. 111134973, Response filed Mar. 27, 2024 to Office Action mailed Oct. 5, 2023", with english claims, 14 pages.

"Japanese Application Serial No. 2024-516901, Voluntary Amendment Filed May 15, 2024", with machine English translation, 9 pages.

\* cited by examiner

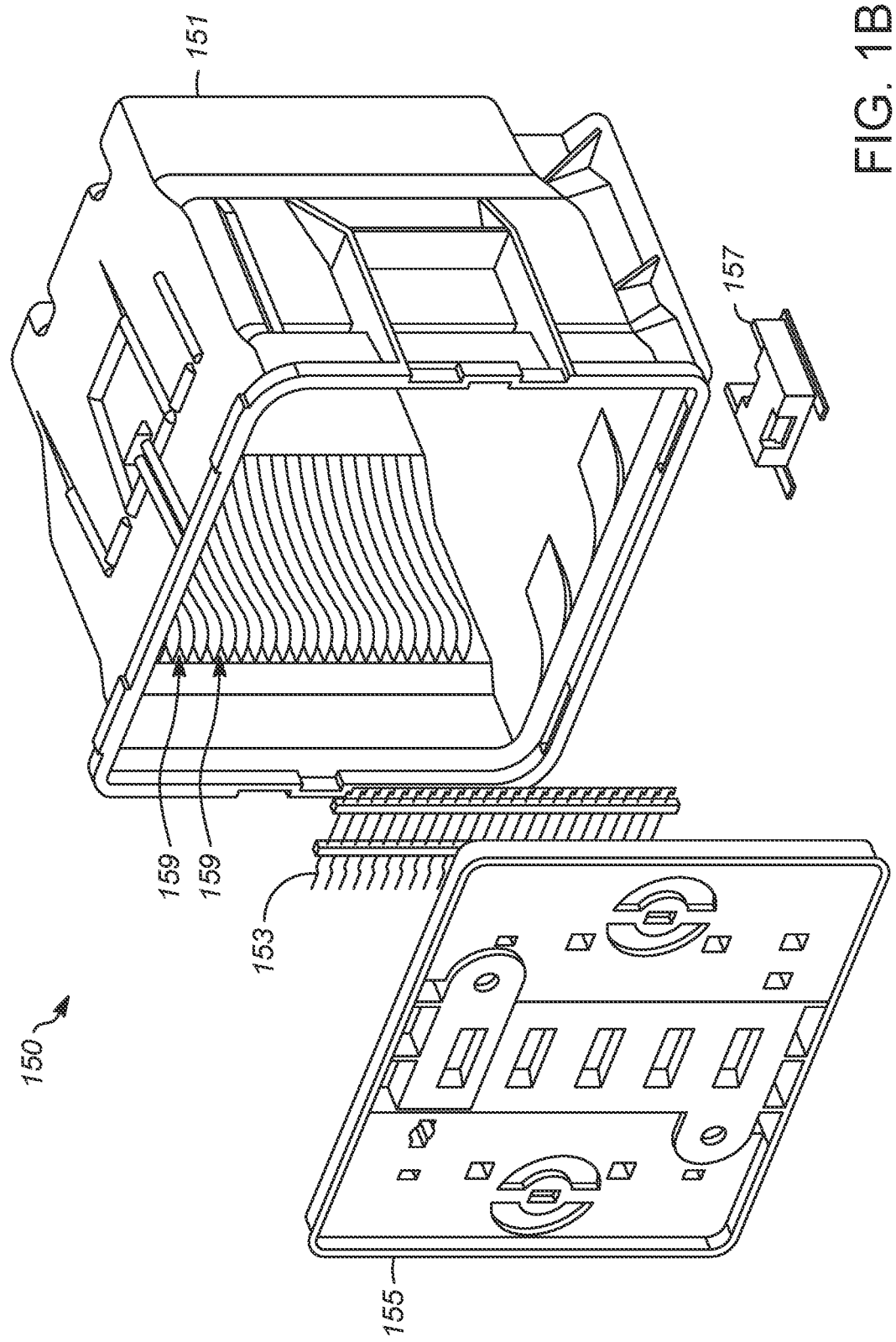

SUBSTRATE MAPPING USING DEEP NEURAL-NETWORKS

TECHNOLOGY FIELD

The disclosed subject matter is related generally to the field of substrate-inspection and metrology tools used in the semiconductor and allied industries (e.g., flat-panel display and solar-cell production facilities). More specifically, in various embodiments, the disclosed subject matter is related to a mapping system that is able to determine a classification state of substrate (e.g., wafers) with a substrate carrier (e.g., a wafer cassette).

BACKGROUND

Various types of substrates, such as semiconductor wafers, are typically placed into various types of substrate carriers, such as a wafer cassette, for processing and metrology operations within a fabrication facility (e.g., such as an integrated circuit manufacturing facility). However, prior to starting an operation, it is desirable to know if all substrates within a carrier are loaded properly within the carrier, and which substrate slots within the carrier are occupied by a substrate.

SUMMARY

This document describes, among other things, the mapping of substrates within a substrate carrier, and a classification of a state of each substrate, as well as the carrier in which the substrate are placed. In various examples provided herein, an image acquisition system, such as a camera, acquires one or more images of the substrates within the carrier. The images are then processed with a deep-convolutional neural-network to classify a state of the substrate slot of the carrier including empty slots, occupied slots (e.g., properly loaded slots), double-loaded slots, cross-slotted, and protruded (where a substrate is not fully loaded into a slot).

In various embodiments, the disclosed subject matter is a method for classifying a state of a number of substrates within locations in a substrate carrier. The method includes detecting at least a portion of the substrates in the substrate carrier. The detecting includes capturing one or more images of the portion of the substrates and the locations proximate to the portion of the substrates, transferring the one or more images to a pre-trained deep-convolutional neural-network, classifying the state of the portion of the substrates within the locations within the substrate carrier from the images using the pre-trained deep-convolutional neural-network, and providing an automatic tagging of each of the plurality of locations within the substrate carrier that are proximate to the portion of the plurality of substrates.

In various embodiments, the disclosed subject matter is a substrate-mapping system. The substrate-mapping system includes a camera to collect one or more images of substrates and potential locations of substrates in a substrate carrier, and a data-collection and control system. The one or more images include a relationship of the substrates and locations of the substrates relative to a number of substrate slots in the substrate carrier. The data-collection and control system includes one or more hardware-based processors of a machine coupled to the camera and is arranged to transfer the one or more images to a deep-convolutional neural-network, classify a state of the portion of the imaged ones of the substrates within the locations of the substrate within the substrate carrier from the one or more images using the deep-convolutional neural-network, and provide an automatic tagging of each of the locations of the substrates within the substrate carrier that are proximate to the portion of the imaged ones of the substrates.

In various embodiments, the disclosed subject matter is a computer-readable medium containing instructions that, when executed by a machine, cause the machine to perform operations including detecting at least a portion of the substrates in the substrate carrier. The detecting includes capturing one or more images of the portion of the substrates and the locations proximate to the portion of the substrates, transferring the one or more images to a pre-trained deep-convolutional neural-network, classifying the state of the portion of the substrates within the locations within the substrate carrier from the images using the pre-trained deep-convolutional neural-network, and providing an automatic tagging of each of the plurality of locations within the substrate carrier that are proximate to the portion of the plurality of substrates.

BRIEF DESCRIPTION OF FIGURES

Various ones of the appended drawings merely illustrate example implementations of the present disclosure and should not be considered as limiting its scope.

FIG. 1B shows a front-opening unified-pod (FOUP), usable with various embodiments of the disclosed subject matter;

DETAILED DESCRIPTION

Figure 1A:
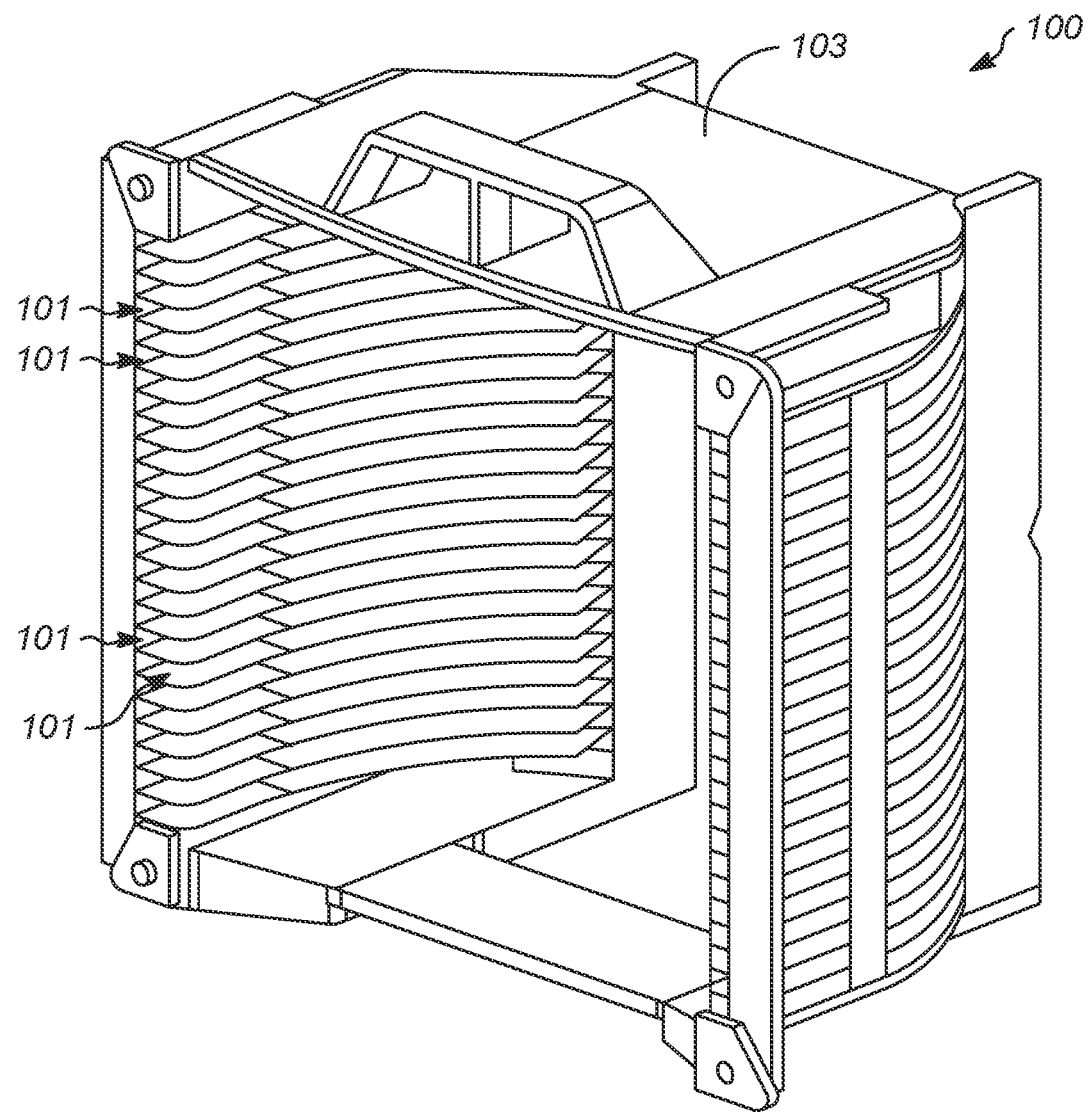
FIG. 1A shows a substrate carrier, usable with various embodiments of the disclosed subject matter.

The disclosed subject matter is related to detecting and mapping substrates (e.g., silicon wafers) in a substrate carrier (e.g., such as a wafer cassette or front-opening unified pod (FOUP)). Often, contemporary substrate-carrier mapping solutions do not work well in a fabrication environment (e.g., semiconductor fabs). For example, compound fabs have a wide range of substrate diameters (e.g., 75 mm, 100 mm, 125, mm, 150 mm, 200 mm, and 300 mm), substrate types (e.g., silicon, sapphire, gallium arsenide (GaAs), silicon carbide (SiC) and other III-V and II-VI compound semiconductors, bonded wafers, etc.), as well as substrate thicknesses (e.g., from 150 µm or less to 2000 µm or more). Back-end of line (BEOL) processes that use bonded substrates may also have a variety of different substrates within a single substrate carrier.

Various attempts at substrate-mapping solutions currently exist. However, current mapping solutions of a substrate carrier (e.g., such as a silicon-wafer cassette) do not work well for, for example, front-end compound fabrication facilities (fabs) and back-end fabs.

For example, one approach use optical sensors mounted to robot end-effectors used to remove and place substrates into the carrier. The end-effector-mounted optical sensors do operate in certain situations but are slow and time consuming to configure because they require an additional sweep step to be performed by the robot handling-system.

Certain other approaches use optical sensors mounted to load-port doors. However, load-port-mounted optical sensors cannot handle the diversity of substrate types and thicknesses because (1) the optics are in a fixed position; and (2) the optics rely on a fixed wavelength of light. Also, most compound fabs manually load carriers because the fabs are space constrained. Therefore, there is no moveable load port onto which the sensors may be mounted.

Certain other approaches use cameras to observe an entire carrier of substrates concurrently. Camera-based systems can also be used with manually-loaded systems since the camera does not require mounting on a load port. Lighting requirements for a camera-based system are minimal, since, for example, a color camera can work with ambient lights in a fabrication environment, as well as function with all or most broad-spectrum dedicated lighting. However, the camera-based solutions that have been tried were often not successful because edge detection of a substrate, such as a silicon wafer, can pose an insurmountable problem for classical image-processing algorithms. For example, many substrates are highly specular, causing reflections from both adjacent substrates within the carrier as well as the room of the fab to appear in the image. Further, the shape of the edge of the substrate can vary. For example, a rounded edge will have a distinct glint in the image. In contrast to the rounded edge, a square edge of a substrate will appear black. Further, a fiducial on a substrate, used to identify a crystallographic orientation of the substrate, can appear in any location in the image. Also, as noted above, slots within a substrate carrier have a significant amount of tolerance designed in (i.e., the slots are generally produced to be overly large). Consequently, the large slots make it difficult to rely on the edges of substrates being in same location on each load.

As disclosed herein, a deep-convolution artificial-neural-network (identified herein as deep-convolution-type system or convnet for brevity of notation) can classify the carrier type as well as all substrates contained therein. A generalized deep-convolution-type system is explained in detail below. However, based upon reading and understanding the disclosed subject matter, a person of ordinary skill in the art will recognize that any type of deep-convolution-type system can be used with the disclosed subject matter described herein. The same or similar type of deep-convolution-type system can be used to classify a state of each slot within the carrier (e.g., properly loaded, double-slotted, cross-slotted, missing, etc.). Various embodiments of the disclosed subject matter can scan and characterize an entire substrate carrier (e.g., a wafer cassette with 25 wafers) in less than two seconds.

Using a deep-convolutional neural-network, in its simplest form, for a given input or set of inputs produces a given output. In this case, an input consisting of a number of images acquired of substrates within a carrier (e.g., wafers in a cassette) will produce an output that shows a classification state of each of the substrates. For example, a classification state of a substrate can include a substrate within each substrate slot within the carrier including empty slots, occupied slots (e.g., properly loaded slots), double-loaded slots, cross-slotted, and protruded (where a substrate is not fully loaded into a slot). The input-to-output relationship comes from training the deep-convolutional neural-network. Such training operations are described herein.

For example, in a specific exemplary embodiment, the deep-convolutional neural-network may comprise ResNet-18. In this implementation of ResNet, there are 18 residual blocks in the architecture, which may use up to millions of images during the training period of the network. For example, ResNet may use a smaller number of layers (e.g., tens of layers as opposed to hundreds of layers in other network types) to avoid degradation problems caused by very-deep residual networks. The degradation problems in very-deep residual networks often converged at a higher error rate, thereby degrading the performance of a network model. With ResNet, degradation problems are generally remedied by introducing residual blocks in which intermediate layers of a block learn a residual function with reference to a block input. In general, an input to a layer may be passed directly or as a shortcut (a "skip connection") to another layer. A residual function can be considered as a refinement step in which an input feature map is adjusted for higher quality features. This compares with a plain network in which each layer is expected to learn new and distinct feature maps. In the event that no refinement is needed, intermediate layers can learn to gradually adjust their weights toward zero such that the residual block represents an identity function.

However, the use of ResNet-18 is only one example. A more generalized example of neural networks is described in detail below with reference to FIGS. 4A through 4D.

As noted above, the disclosed subject matter uses use a deep-convolutional neural-network and treats each substrate as a classification problem. Camera images of the substrates and surrounding areas (e.g., the substrate carrier) are cropped and/or scaled into images to match a trained convnet size of the original image size used to train the system. In an embodiment, the cropped or scaled images are divided as one image per substrate slot or images that include several slots (e.g., three or more slots). The image or images are then processed with a deep-convolutional neural-network to classify a state of the substrate slot including empty slots, occupied slots (e.g., properly loaded slots), double-loaded slots, cross-slotted, and protruded (where a substrate is not fully loaded into a slot).

For example, with reference now to FIG. 1A, a substrate carrier 100, usable with various embodiments of the disclosed subject matter is shown. The substrate carrier 100 is often used to store or transport substrates (e.g., silicon wafers) during semiconductor manufacturing operations, such as substrate processing (e.g., deposition and etching operations) or metrology operations (e.g., measurements of film thickness and critical dimensions (CDs) of planned features fabricated on the substrate). The substrate carrier 100 includes a carrier body 103 and a number of slots 101 into which substrates may be loaded. The carrier body 103 may comprise a plastic material such as polyetheretherketone (PEEK), polypropylene, or perfluoroalkoxy alkane (PFA). In a specific example, the substrate carrier 100 is a 25-slot cassette into which up to 25 silicon wafers (e.g., from 75 mm to 200 mm in diameter) may be loaded.

FIG. 1B shows a front-opening unified-pod (FOUP) 150, usable with various embodiments of the disclosed subject matter is shown. The FOUP 150 is typically used to store or transport 300 mm wafers. The FOUP 150 is shown to include a FOUP carrier body 151 having a number of slots 159, a substrate door-retainer 153, a FOUP door 155, and a substrate center-retainer 157. The substrate door-retainer 153 and the substrate center-retainer 157 help retain substrates loaded within the FOUP 150 from too much movement and thereby minimizes or prevents damage to the substrates. The FOUP is used for purposes similar to the substrate carrier 100 of FIG. 1A but, due to features such as the substrate door-retainer 153 and the substrate center-retainer 157, the FOUP 150 can generally prevent many of the issues with improper substrate placement and loading from arising as noted below with FIGS. 2A through 2D, as can occur with the substrate carrier 100 of FIG. 1A.

The FOUP 150 is a specialized plastic (e.g., polycarbonate) enclosure designed to hold, for example, 300 mm silicon wafers securely and safely in a controlled environment. The FOUP 150 can allow substrates to be transferred between machines (e.g., processing tools and metrology tools) for processing and measurement, typically by an automated material-handling system.

Figure 2A:
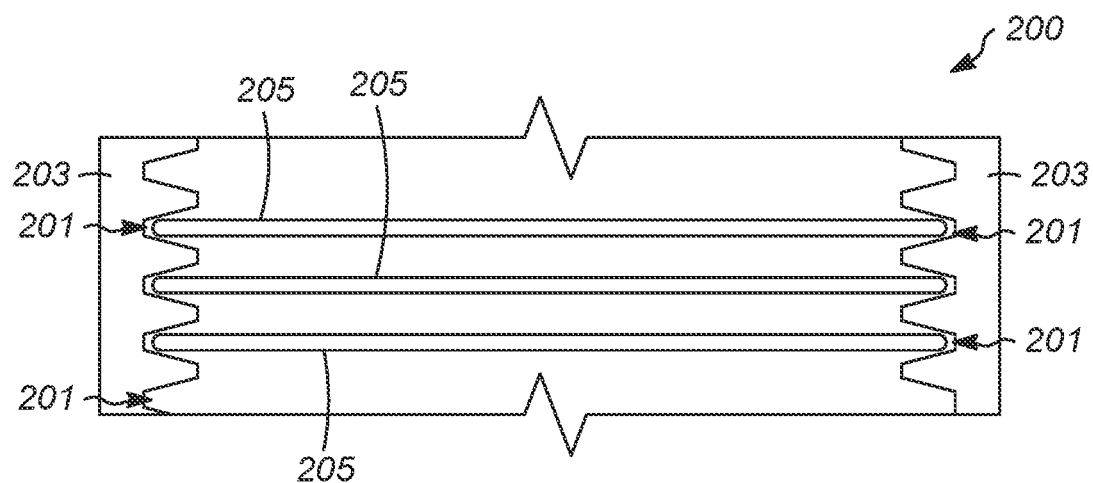
FIG. 2A shows a cross-sectional portion of a substrate carrier containing substrates loaded in the substrate carrier.

FIG. 2A shows a cross-sectional portion 200 of a substrate carrier (e.g., similar to or the same as the substrate carrier 100 of FIG. 1A) containing substrates 205 loaded in the substrate carrier. A body 203 of the substrate carrier includes a number of substrate slots 201 (five pairs of slots shown in this example) into which a substrate may be loaded. Three of the substrates 205 are loaded into respective proper ones of the substrate slots 201.

Figure 2B:
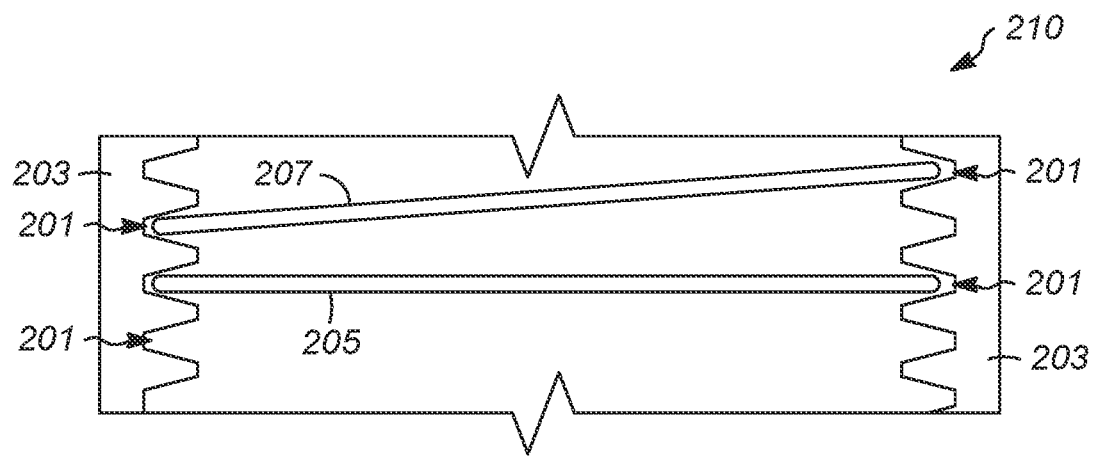
FIG. 2B shows a cross-sectional portion of a substrate carrier containing substrates, one of which is cross-slotted in the substrate carrier.

FIG. 2B shows a cross-sectional portion 210 of a substrate carrier containing a substrate 205 loaded into the substrate carrier. FIG. 2B also shows a substrate 207 that is "cross-slotted" in the substrate carrier; that is, the substrate 207 has a left-edge mounted into a second (from the uppermost slot) of the substrate slots 201 on the left side of the substrate carrier and a right-edge of the substrate 207 is mounted into an uppermost one of the substrate slots 201 on the right side of the substrate carrier. Because of the cross-slotted mounting of the substrate 207, an end-effector of a robot (e.g., a transfer robot), or other automated substrate extraction tool, would generally be unable to remove the substrate 207 from the carrier due to the angle at which the substrate 207 is oriented.

Figure 2C:
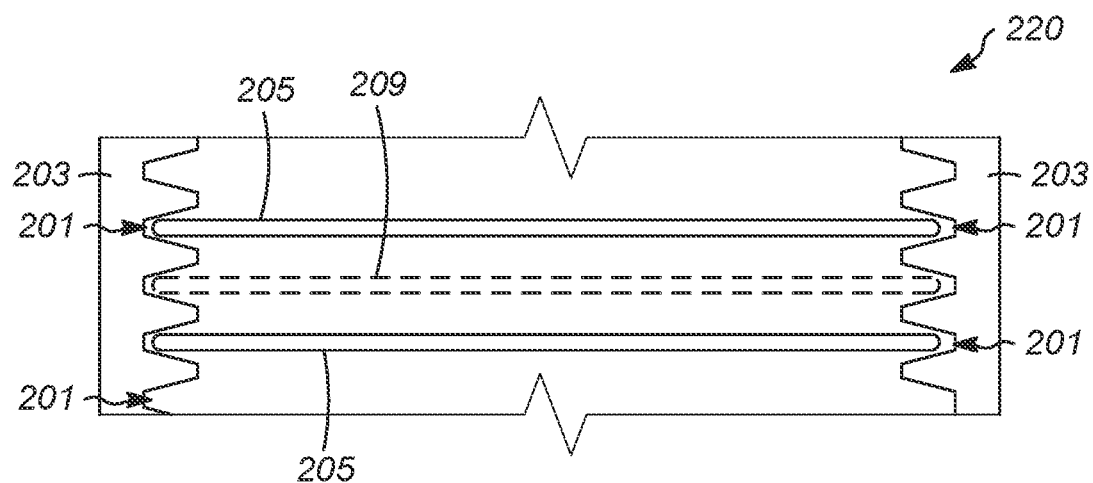
FIG. 2C shows a cross-sectional portion of a substrate carrier containing a position in the substrate carrier for which a substrate is missing, along with substrates that that are properly loaded in the substrate carrier.

FIG. 2C shows a cross-sectional portion 220 of a substrate carrier containing two of the substrates 205 that are loaded into respective proper ones of the substrate slots 201 and a location showing an area 209 where a substrate should be located (missing substrate). Since a substrate is not loaded into the area 209, the robot designed to transport the missing substrate wastes time and effort.

Figure 2D:
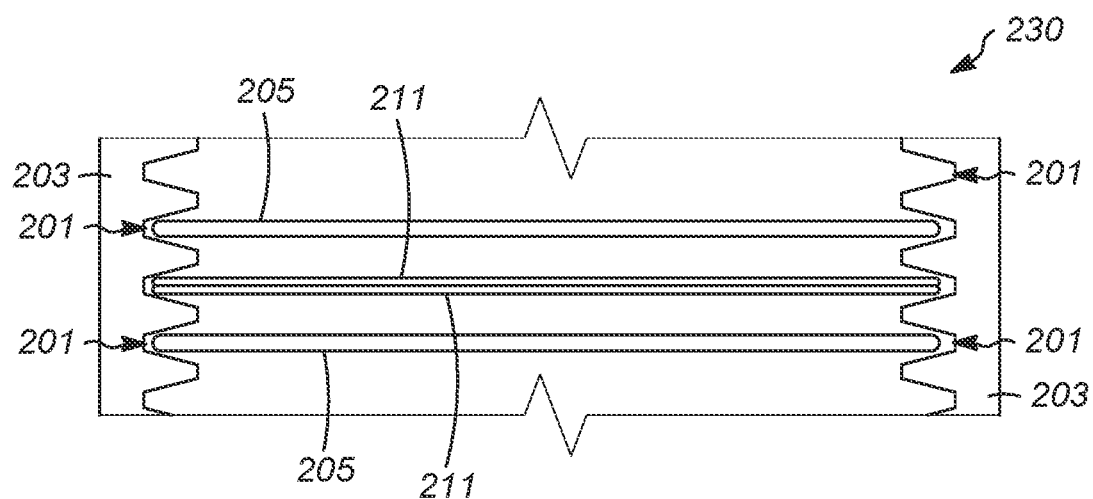
FIG. 2D shows a cross-sectional portion of a substrate carrier containing a double-loaded substrate, along with substrates that that are properly loaded in the substrate carrier.

FIG. 2D shows a cross-sectional portion 230 of a substrate carrier containing a double-loaded substrate 211 (two substrates are loaded at the same level into a single set of the substrate slots. Two of the substrates 205 are loaded into respective proper ones of the substrate slots 201. However, as with the substrate carrier of FIG. 2B, an end-effector of a robot, or other automated substrate extraction tool, would generally be unable to remove either of the double-loaded substrates 211 from the carrier due to the double loading, or alternatively, may be able to load the bottom one of the double-loaded substrates 211. The top one of the double-loaded substrates 211 may be pulled at least partially out or may simply be loaded improperly in a processing or metrology tool. In other cases, the top one of the double-loaded substrates 211 may be pulled at least partially out and may later be dropped. Either way, the robot would not be able to subsequently return the single one of the double-loaded substrates 211 back into the same pair of slots 201.

In addition to the possible problems described above, any one of the cross-sectional portions 200, 210, 220, 230 of the substrate carriers shown in FIGS. 2A through 2D may have one or more of the substrates 205, 207, 211 not fully loaded into respective ones of the substrate slots 201. That is, one or more of the substrates 205, 207, 211 may be protruding (i.e., out from the drawing page) from the substrate carrier. Therefore, even if an end-effector of a robot is able to attach to the substrate (e.g., the substrate 205), the end-effector may attach to the substrate too far back on the substrate, making proper placement on a process or metrology tool difficult or impossible. Aspects of the disclosed subject matter can also detect protruding ones of the substrate, as described below.

To detect these and other problems identified above, the disclosed subject matter uses a deep-convolutional neural-network based on a number of images to classify images capture by an image-acquisition system. To avoid having to collect millions of images, transfer learning may be used. In examples, the number of images typically used to train the network may be from about 5000 images to about 50,000 images. The training starts with a pre-trained network. In embodiments, the last five to ten layers are trained, using a limited amount of image data. Such a training regimen limits computational requirements that are frequently encountered in more complex deep-convolutional neural-network systems.

The training may start with a mix of example images— including images of various types of substrates, in various types of carriers, and relationships of substrates to substrate slots in the carriers. The images can include multiple images of a given substrate, or multiple images covering multiple slots of the carrier (e.g., three slots so as to detect, for example, cross-slotted substrates, even though the image may include the entire substrate carrier). The carrier size may be classified, as well as the thickness or thicknesses of the substrates within the carrier. Also, in addition to the classification status noted herein, other characteristics of a substrate, such as substrate thickness, substrate bow, substrate warp, substrate droop (e.g., from a thinned substrate) may be noted to adjust a locational position (e.g., a pick position) between the end-effector of a robot and the substrate due to one or more of the substrate characteristics. The characteristics may be noted to, for example, avoid a collision between the end-effector of a robot and the substrate due to one or more of the substrate characteristics. Therefore, the training may start with a generalization of images, down to specific substrate types, and then auto-tagging of substrate according to the classification status of each substrate as described above (e.g., double-slotted, missing, protruded, etc.). The auto-tagging of each substrate is based on the output from the deep-convolutional neural-network.

In addition to the classification status, the auto-tagging can also include an identification (e.g., an ID number) associated with each substrate in a given carrier and an automatic tagging of each of the plurality of locations within the substrate carrier that are proximate to the portion of the plurality of substrates.

Figure 3:
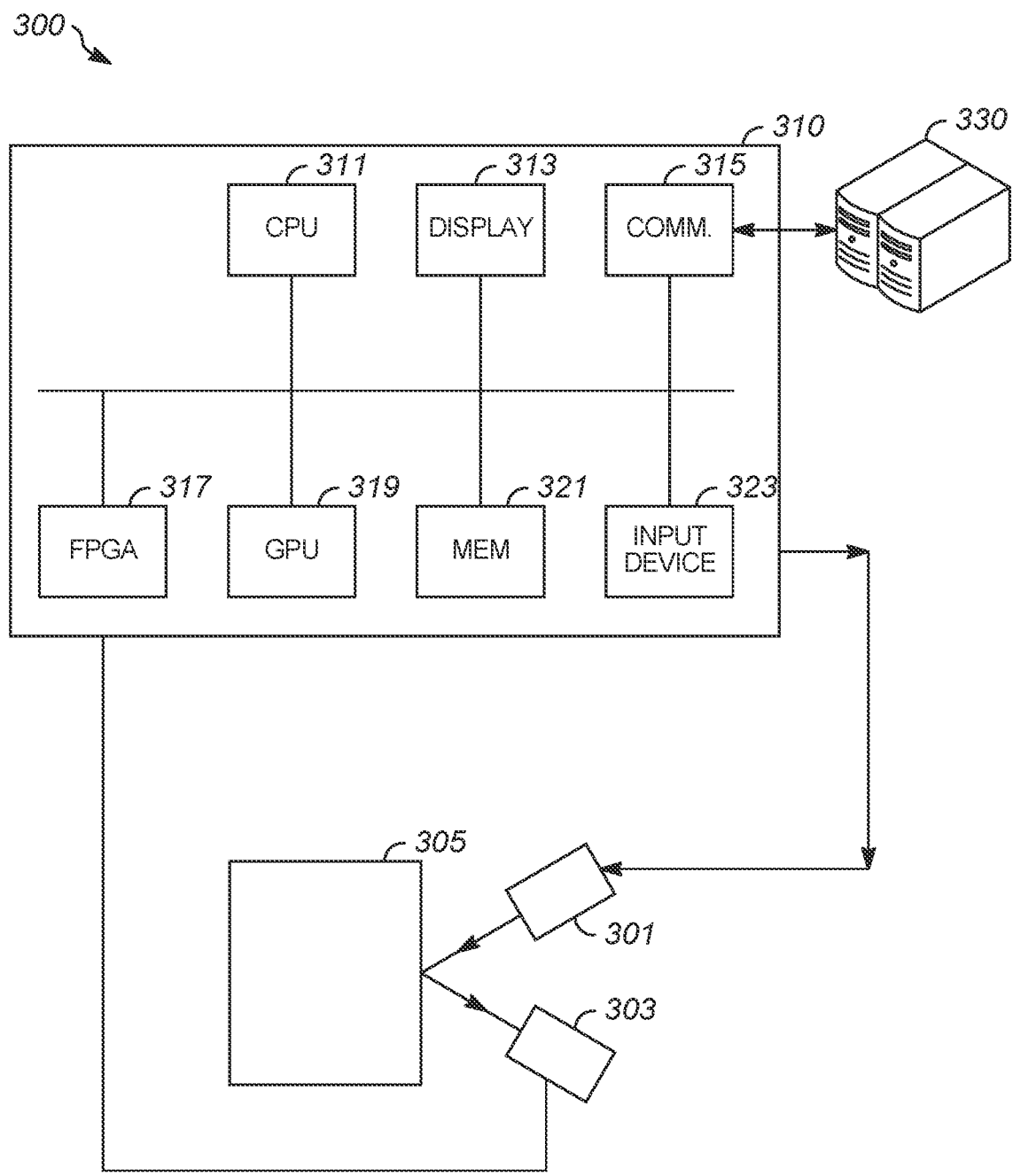
FIG. 3 shows an example of a substrate-mapping system, in accordance with embodiments of the disclosed subject matter.

FIG. 3 shows an example of a substrate-mapping system 300, in accordance with embodiments of the disclosed subject matter. The substrate-mapping system 300 can be used to perform one or more techniques shown and described herein and includes a system to detect the placement (both correct and incorrect placements) of substrates within, for example, the substrate carrier (e.g., such as the substrate carrier 100 of FIG. 1). The substrate-mapping system 300 includes at least a portion of a machine-learning network.

The substrate-mapping system 300 may first be used in a training mode to train the machine-learning network and may then later be used in a normal-operation mode to detect the placement of substrates within, for example, the substrate carrier. In various examples, the training mode may be performed by a manufacturer of the substrate-mapping system 300. Data obtained from the training mode may then be used at, for example, a fabrication facility to determine an actual classification state (e.g., properly-loaded substrate, cross-loaded substrate, double-loaded substrate, or protruded substrate, as described above with reference to FIGS. 2A through 2D) in a normal-operation mode. Example frameworks using data from the substrate-mapping system 300 is described with reference to FIGS. 4A through 4D, below. Examples of methods using the training and normal-operation modes are described later with reference to FIGS. 5A and 5B.

In an exemplary embodiment, the substrate-mapping system 300 is shown to include a substrate carrier 305, an optional light source 301 to illuminate substrates within the substrate carrier 305, and a camera 303. In various embodiments, both the optional light source 301 and the camera 303 are coupled to a data-collection and control system 310. In various embodiments, the camera 303 may comprise two or more cameras. For example, in order to detect substrate protrusion from the substrate carrier 305, a second camera may be desirable. Also, the camera 303 may comprise multiple cameras to cover different load ports. For example, one or more cameras for load port A, and a second set of one or more cameras for load port B. In various embodiments, a remote data storage and processing unit 330 may also be used. The remote data storage and processing unit 330 may comprise, for example, one or more instantiations of a general-purpose computing device such as a server, a cloud-processing system, a data warehouse, a laptop, a tablet, a smart-phone, a desktop computer, or the like.

The optional light source 301 may comprise a broadband light source, a number of predominantly monochromatic (e.g., single-wavelength) light sources, or a combination of broadband and monochromatic light sources. The optional light source 301 may also include light sources impinging upon the substrate at one or more angles of incidence, with different polarization states, intensities of radiation, and so on. A selection of the optional light source 301 may be used based on specific reflection and/or transmission characteristics of the substrates within the substrate carrier 305. The optional light source 301 can also be configured to work with various films or coatings on the substrate. For example, a yellow light (e.g., having a wavelength of approximately 577 nm) may be used with substrate having a photoresist coating to avoid exposing the photoresist. In other embodiments, a wavelength of light may be selected to illuminate the substrates during the capturing of the images to avoid causing a chemical reaction of one or more films on the substrates. However, in various embodiments, ambient light from within the fab may be sufficient to illuminate substrates within the substrate carrier 305.

The camera 303 may comprise one or more lenses (e.g., there may be a single variable focal-length lens or a plurality of single focal-length lenses) and an image sensor (e.g., a CCD array, a CMOS-based sensor, an active-pixel sensor, or other sensor types), and camera boards having related circuitry to facilitate image extraction. In one example, the camera 303 is a color camera, which can also be an aid in detection of the carrier. A color camera may be desirable since color camera helps because substrate carriers are often a different color than substrate loaded into the carrier. Also, common networks are often trained on color images, which would otherwise cause integration challenges for gray-scale images collected from a monochrome camera. However, with a known carrier type using a network trained using gray-scale images, a monochromatic camera may be used as well. In embodiments, multiple cameras may be used as noted above. For example, two cameras can be used to capture stereo images, which may be useful in making a determination of a classification status, such as whether a substrate is protruding from the substrate carrier 305.

The data-collection and control system 310 is shown to include a central processing unit (CPU) 311, a graphics processing unit (GPU) 319, a field programmable gate array (FPGA) 317 (or other suitable hardware, such as an application-specific integrated circuit (ASIC) or accelerators such as a data processing unit (DPU), artificial neuron network (ANN) and the like), a memory 321, a display 313, an input device 323, and a communication interface 315 (e.g., a high-performance network (HPN)).

The data-collection and control system 310 can also include front-end circuitry such as transmit signal chains, receive signal chains, switch circuitry, digital circuitry, analog circuitry, etc. In embodiments, the transmit signal chain may provide control signals to the optional light source 301. The receive signal chain may receive image signals from the camera 303. The front-end circuitry may be coupled to and controlled by one or more processor circuits, such as the CPU 311, the GPU 319, and the FPGA 317. The CPU 311 may be implemented as one or more multi-core processors. The GPU 319 and the FPGA 317 may be used to accelerate processing of image data collected from the camera 303 and the performance of the machine-learning network as described herein. The techniques shown and described herein can be executed by, for example, the CPU 311 working in conjunction with the CPU 319 for faster processing.

The CPU 311 and the GPU 319, as well as other components of the data-collection and control system 310, may be coupled to the memory 321, such as to execute instructions that cause the data-collection and control system 310 to perform one or more of light source illumination, image acquisition (as described in more detail below), processing, or storage of data relating to the image acquisition, or to otherwise perform techniques as shown and described herein. The data-collection and control system 310 can be communicatively coupled to other portions of the substrate-mapping system 300, such as by using a wired or wireless version of the communication interface 315.

The performance of one or more techniques as shown and described herein can be accomplished in the data-collection and control system 310 or using other processing or storage facilities such as using the remote data storage and processing unit 330. For example, processing tasks that may be undesirably slow if performed on the data-collection and control system 310, or beyond the capabilities of data-collection and control system 310, can be performed remotely (e.g., on a separate system), such as in response to a request from data-collection and control system 310. Similarly, storage of imaging data or intermediate data can be accomplished using remote facilities communicatively coupled to the data-collection and control system 310. The data-collection and control system 310 may also include the display 313, such as for presentation of configuration information or results, and the input device 323, such as including one or more of a keyboard, a trackball, function keys or soft keys, a mouse-interface, a touch-screen, a stylus, or the like, for receiving operator commands, configuration information, or responses to queries.

As described above, the data-collection and control system 310 may receive one or more images of substrates within the substrate carrier 305, as well as images of substrates and potential locations of substrates (to determine if there is a missing substrate) in the substrate carrier 305. The images also include a relationship of the substrates and potential locations of substrates relative to the substrate slots 201 (see FIG. 2A) in the substrate carrier. The data-collection and control system 310 may perform one or more techniques as shown and described herein to classify the substrates and the carrier. Further, some or all aspects of the data-collection and control system 310 can be run and controlled remotely.

Figure 4A:
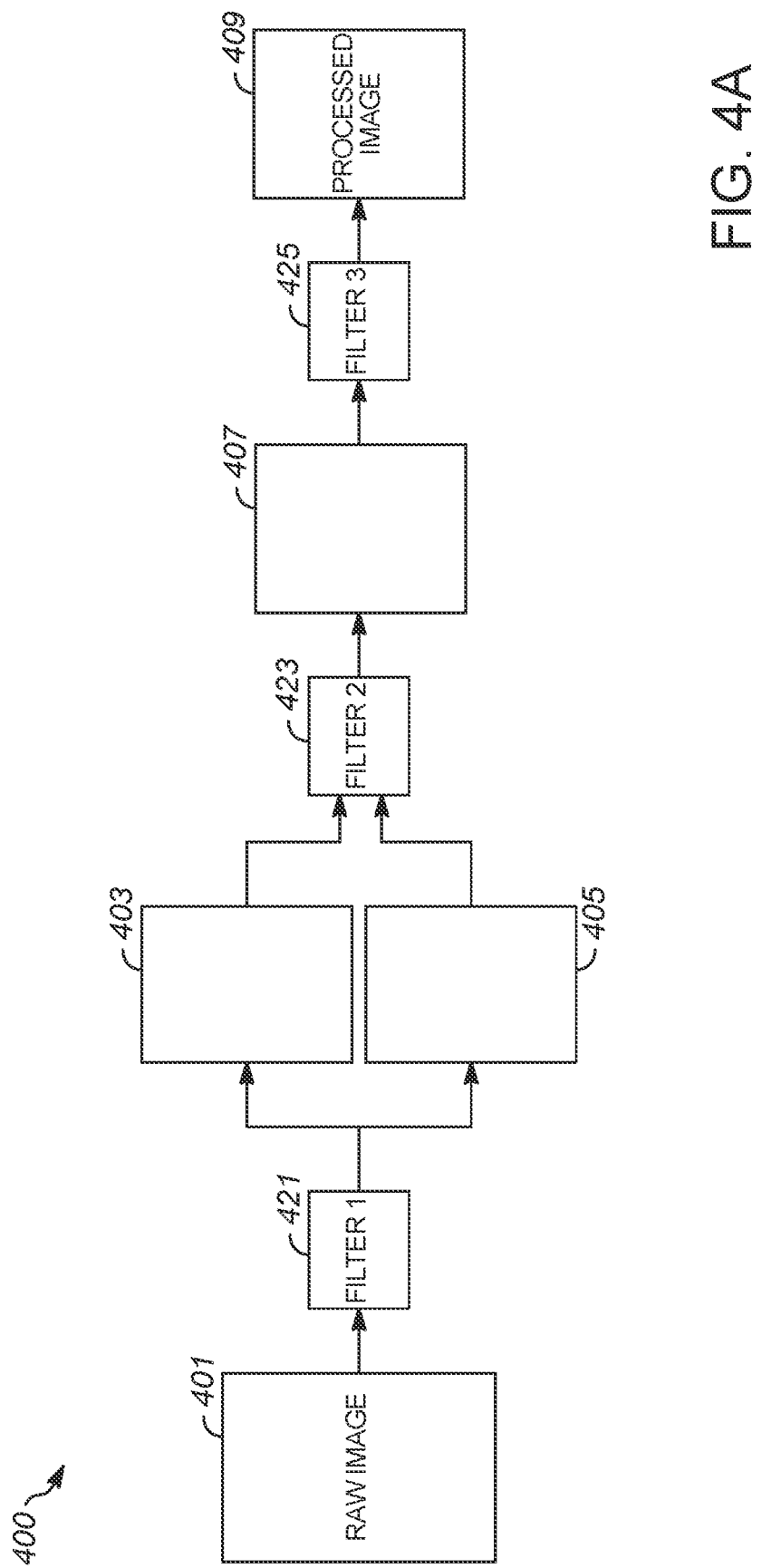
FIG. 4A shows an example of a pre-processing system that may be used with the substrate-mapping system of FIG. 3, in accordance with various embodiments of the disclosed subject matter.

FIG. 4A shows an example of a pre-processing system 400 that may be used with the substrate-mapping system of FIG. 3, in accordance with various embodiments of the disclosed subject matter. Upon reading and understanding the disclosed subject matter, a person of ordinary skill in the art will recognize that a number of different deep-convolutional neural-networks, such as a residual-neural network (ResNet, such as ResNet-18 as described above), may be used instead of or in addition to the example pre-processing system of FIG. 4A, or the example pre-processing system of FIG. 4C or FIG. 4D, described below. The camera 303 of FIG. 3 is used to obtain a large number of raw images of the substrate within the substrate carrier 305. Each of the images may then be processed concurrently or sequentially. For example, a raw image 401 of the substrates may be manipulated by various techniques. In one example, the raw image may be manipulated using transformation techniques to form a transformed image in an abstract Hilbert space. For example, the transformation may include Fourier transformations, Laplace transformations, or other suitable transformation techniques. For color images, these process may apply to one or a combination of the original colors provided by the camera 303.

The raw image 401 (or transformed image) may then be filtered by one or more filters in real space and/or Hilbert space, including linear and non-linear filters. For example, the raw image 401 (or transformed image) may be filtered by a first filter 421 (filter 1) to generate a first set of intermediate images 403, 405 (the example of FIG. 4A shows only two intermediate images but any number of intermediate images may be generated if and as needed). The first filter 421 may be provided as one or more linear filters in, for example, different bandwidths of light. The first set of intermediate images 403, 405 may then be combined and filtered by a second filter 423 (filter 2) to generate a second intermediate image 407. The second filter 423 may be provided as one or more linear or other types of filter. The second intermediate image 407 may be filtered by a third filter 425 (filter 3) to generate a pre-processed image 409. The third filter 425 may be provided as one or more non-linear filters or other types of filter. The pre-processing may make the contrast in the image more pronounced, or increase edge detection, thus aiding in detecting and classifying a position of substrates as described herein.

Figure 4B:
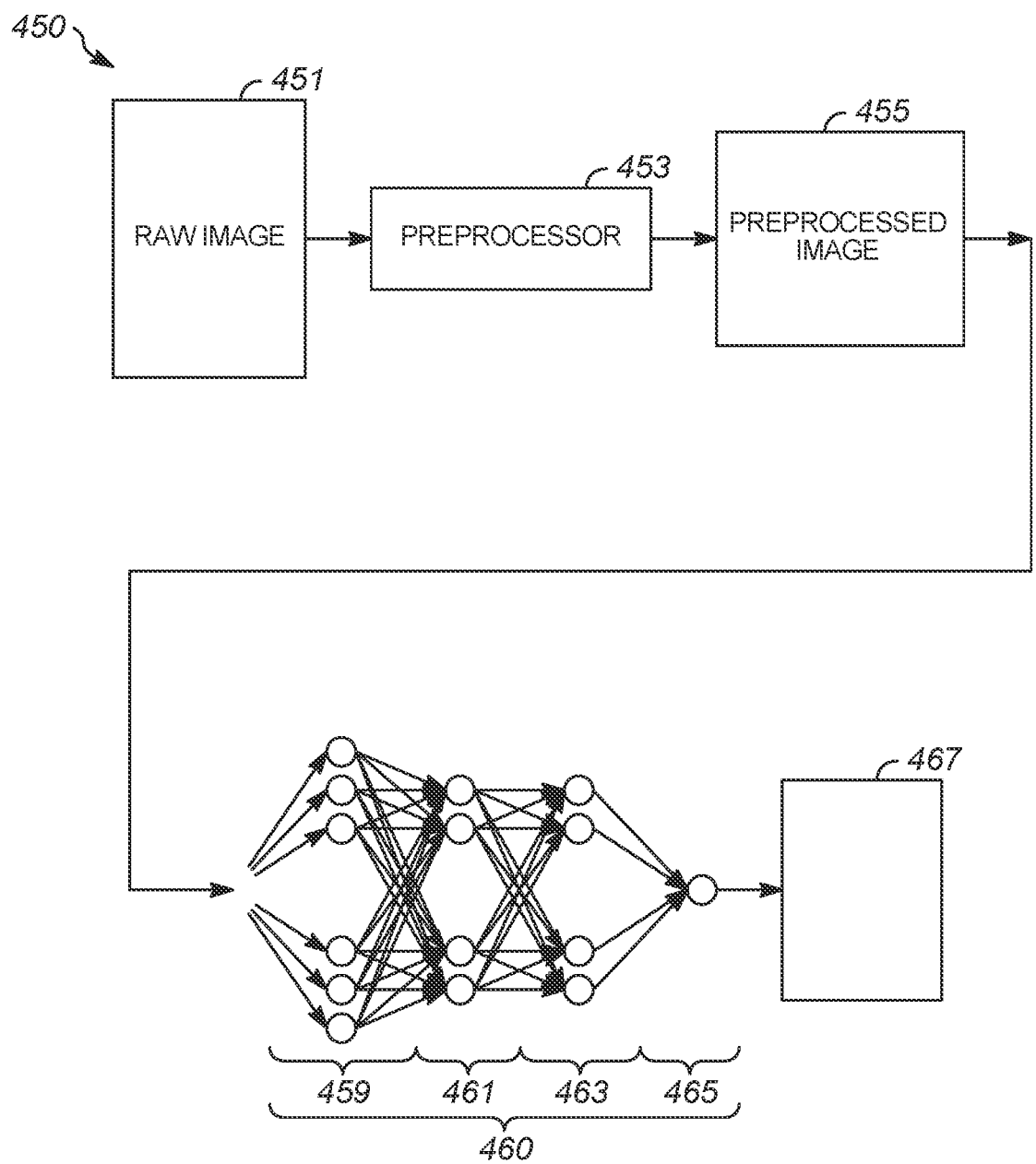
FIG. 4B shows an example of a framework to detect substrate loading errors in a carrier from images obtained from the substrate-mapping system of FIG. 3, in accordance with various embodiments of the disclosed subject matter.

FIG. 4B shows an example of a framework 450 to detect substrate loading errors in a carrier from images obtained from the substrate-mapping system of FIG. 3, in accordance with various embodiments of the disclosed subject matter. As described above, the framework 450 may be used in a training mode to train the machine-learning network and may then be used in normal-operation mode to classify substrates in a fabrication environment. Examples of the training and normal-operation modes are described later with reference to FIGS. 5A and 5B.

As shown in FIG. 4B, the framework 450 is shown to include a preprocessor 453 and a machine-learning network 460. A raw image 451 is provided to the preprocessor 453. In this example, the preprocessor 453 filters or otherwise processes the raw image 451 to, for example, crop, scale, or otherwise change or enhance the raw image 451 and to generate a preprocessed image 455, as described above with reference to FIG. 4A.

The preprocessed image 455 may then be input into the machine-learning network 460. The machine-learning network 460 may be provided as a multi-layered machine learning model. For example, the machine-learning network 460 may include four layers including an input layer 459, a feature-extraction layer 461, a features-relationship layer 463, and a decision layer 465. Pixel information from the preprocessed image 455 may be sent to the input layer 459. Each node in the input layer 459 may correspond to a pixel of the preprocessed image 455. The machine-learning network 460 may, in an iterative fashion, may be trained in one or more of the layers 459-465. The decision layer 465 may output a decision regarding classification of a given substrate. A classification result 467 is then generated. The classification result 467 may extract the detected type of classification from the raw image 451. The classification result 467 may provide a textual indication showing the classification state (e.g., properly-loaded substrate, cross-loaded substrate, double-loaded substrate, or protruded substrate). In an embodiment, the classification result 467 may be input as a command to direct a robot to function with a potentially misplaced or missing substrate (e.g., to move farther forward on the substrate before applying vacuum if protruding from the carrier, to skip missing substrate slots, etc.).

As mentioned above, the framework 450 may first be used in a training mode to train the machine-learning network 460 to classify a state of the substrate. The framework 450 may then be used in a normal-operation mode to classify substrates in a fabrication environment. The training of the machine-learning network 460 may be a supervised process and may be performed offsite from where the classification process is performed. The training may use a set of training images (e.g., one or more training images) with known classification states to train the machine-learning network 460.

Figure 4C:
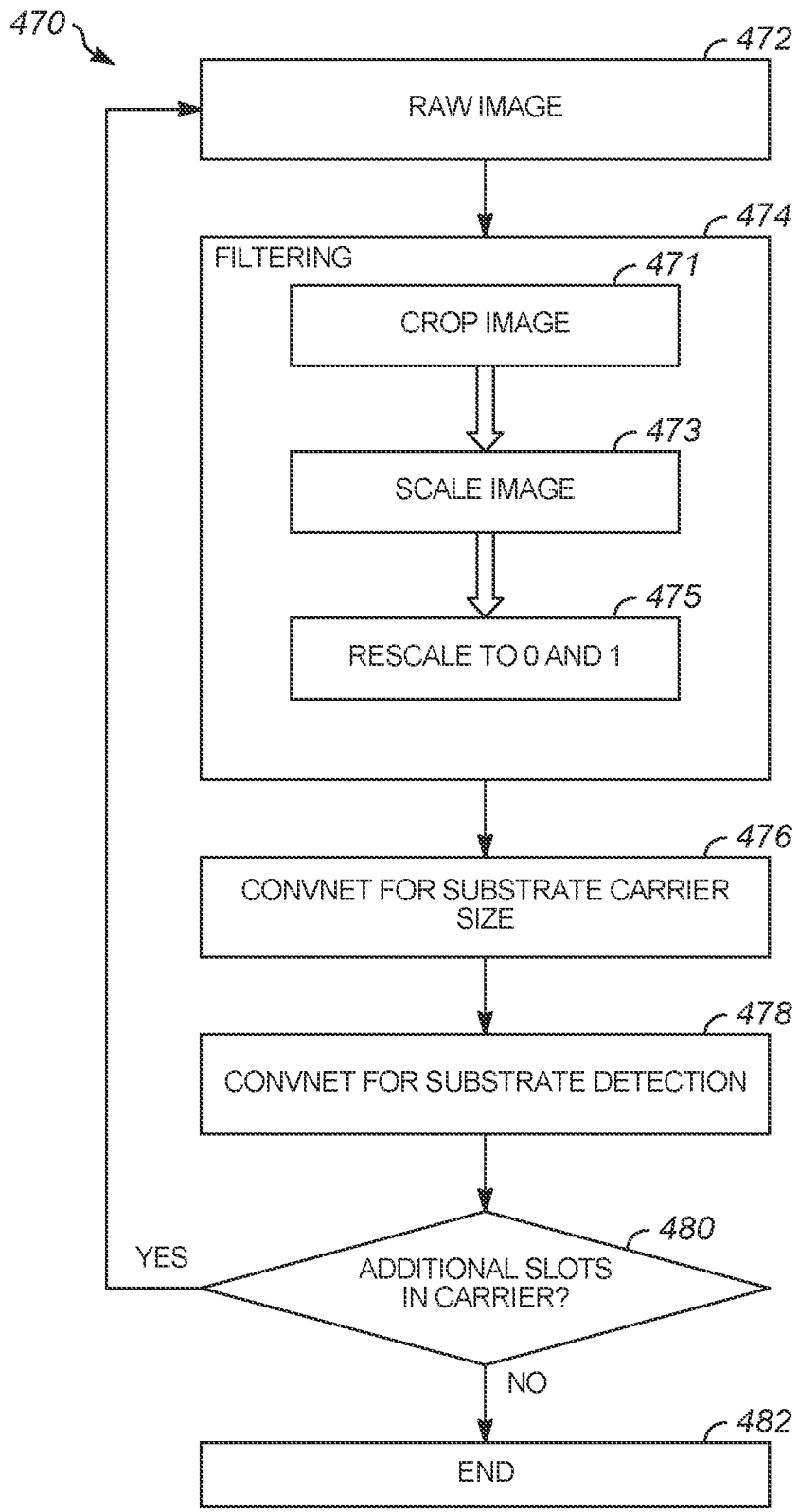
FIG. 4C shows an example of a multiple-network pre-processing system that may be used with the substrate-mapping system of FIG. 3, in accordance with various embodiments of the disclosed subject matter.

FIG. 4C shows an example of a multiple-network pre-processing system 470 that may be used with the substrate-mapping system of FIG. 3, in accordance with various embodiments of the disclosed subject matter. Upon reading and understanding the disclosed subject matter, a person of ordinary skill in the art will recognize that a number of different deep-convolutional neural-networks, such as a residual-neural network (ResNet, such as ResNet-18 as described above), may be used instead of or in addition to the example pre-processing system of FIG. 4C. The multiple-network pre-processing system 470 is shown to include a raw image input block 472, a filtering block 474, a convnet substrate-carrier-size processing block 476, a convnet substrate-detection processing block 478, and a decision block 480 to determine when all substrate slots (e.g., 25 slots) within a substrate carrier have been processed.

The camera 303 of FIG. 3 is used to obtain at least one raw image of the substrate within the substrate carrier 305 (or a large number of raw images if the multiple-network pre-processing system 470 is being used for training purposes). Each of the images may then be processed sequentially (an example of concurrent processing of the images is provided below with reference to FIG. 4D). For example, a raw image of the substrate is provided as an input to the raw image input block 472. The raw image may then be manipulated by various techniques. In one example, the raw image is cropped to a rough location in accordance with a physical structure of the substrate carrier in a crop image block 471. In a scale image block 473, the cropped image is either interpolated or extrapolated to a trained convnet size, relating back to the training size used in the original machine-learning network. The scaled image is then rescaled to between 0 and 1 in a floating point range to an integer range within the rescale block 475. The integer range can be chosen to have a given value of precision (e.g., as one of 256 discrete steps for an 8-bit color depth).

After operations within the filtering 474 are completed, the filtered image is input into the convnet substrate-carrier-size processing block 476, which makes a determination of a physical size of the substrate carrier (e.g., a determination of a maximum diameter of a substrate or a number of slots within the carrier). A person of ordinary skill in the art, upon reading and understanding the disclosed subject matter, will recognize that a determination of the substrate carrier size only needs to be performed once per processing of a carrier of substrates. However, the determination may be verified at each loop of the operations.

The convnet substrate-detection processing block 478 then makes a determination, based on the original training data, of whether a substrate is located in each slot, is cross-slotted, is protruded, or double-slotted, or any other parameter for which the multiple-network pre-processing system 470 has been trained. A determination is then made within the decision block 480 as to whether all substrate slots (e.g., 25 slots) within a substrate carrier have been processed. If there are more substrate to process (e.g., if 25 substrate have not been processed), the operation then returns to the raw image input block 472. If all substrate have been processed, the operations of the multiple-network pre-processing system 470 proceed to an end block 482.

Figure 4D:
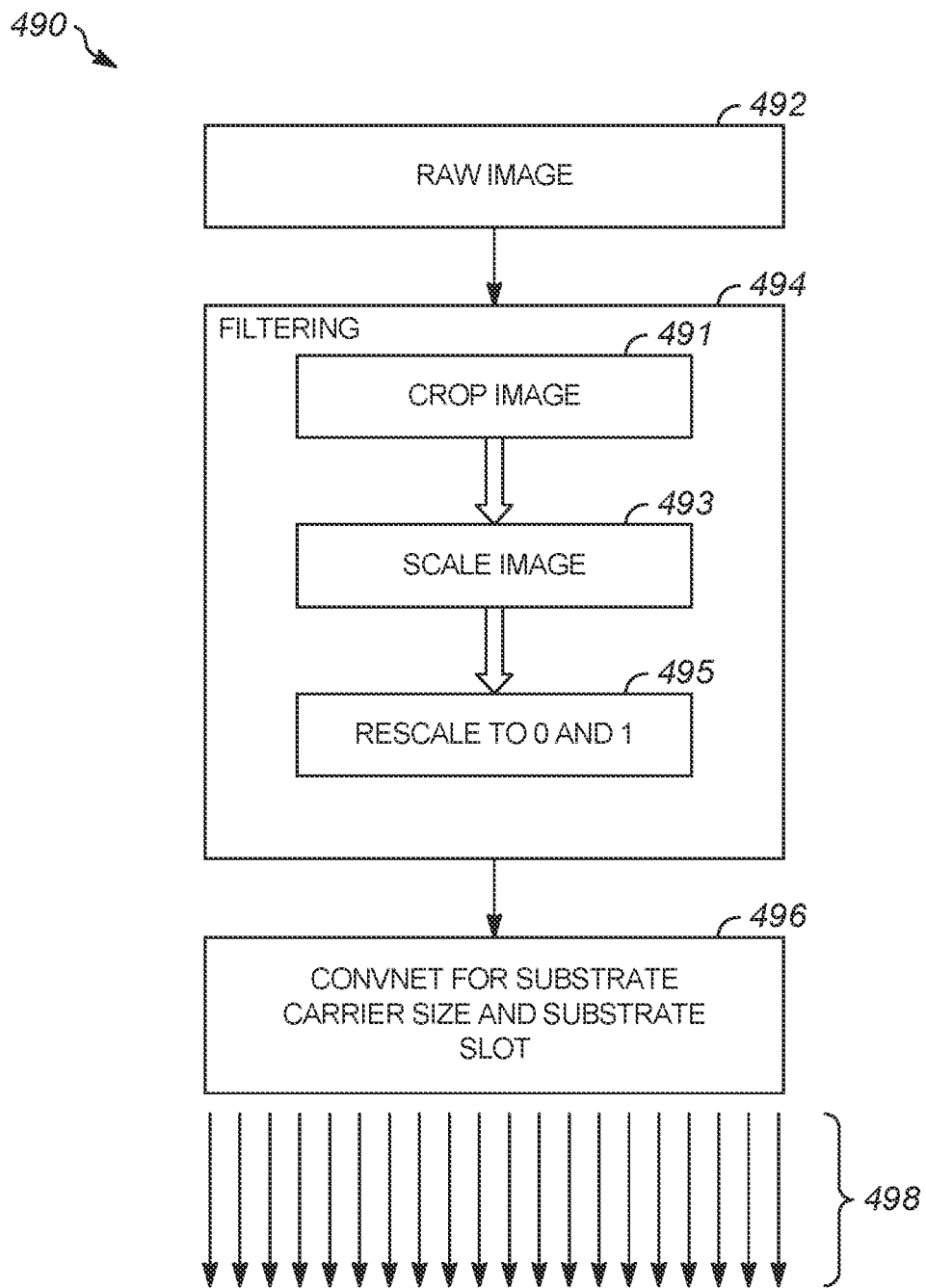
FIG. 4D shows an example of a single-network pre-processing system that may be used with the substrate-mapping system of FIG. 3, in accordance with various embodiments of the disclosed subject matter.

FIG. 4D shows an example of a single-network pre-processing system 490 that may be used with the substrate-mapping system of FIG. 3, in accordance with various embodiments of the disclosed subject matter. Upon reading and understanding the disclosed subject matter, a person of ordinary skill in the art will recognize that a number of different deep-convolutional neural-networks, such as a residual-neural network (ResNet, such as ResNet-18 as described above), may be used instead of or in addition to the example pre-processing system of FIG. 4D. However, each of the various components of FIG. 4D may be the same as or similar to equivalent components, if any, of the multiple-network pre-processing system 470 of FIG. 4C. However, in example operations, the multiple-network pre-processing system 470 of FIG. 4C may function with approximately 10% or fewer of the total number of training images as may be used with the single-network pre-processing system 490.

The camera 303 of FIG. 3 is used to obtain at least one raw image of the substrate within the substrate carrier 305 (or a large number of raw images if the multiple-network pre-processing system 490 is being used for training purposes). Each of the images may then be processed concurrently. For example, a raw image of the substrate is provided as an input to the raw image input block 492. The raw image may then be manipulated by various techniques. In one example, the raw image is cropped to a rough location in accordance with a physical structure of the substrate carrier in a crop image block 491 within a filtering block 494. In a scale image block 493, the cropped image is either interpolated or extrapolated to a trained convnet size, relating back to the training size used in the original machine-learning network. The scaled image is then rescaled to between 0 and 1 in a floating point range to an integer range within the rescale block 495. The integer range can be chosen to have a given value of precision (e.g., as one of 256 discrete steps for an 8-bit color depth).

After operations within the filtering 494 are completed, the filtered image is input into the convnet substrate-carrier-size/slot/substrate detection and processing block 496, which makes a determination of a physical size of the substrate carrier (e.g., a determination of a maximum diameter of a substrate or a number of slots within the carrier) as well as a determination, based on the original training data, of whether a substrate is located in each slot, is cross-slotted, is protruded, or double-slotted, or any other parameter for which the single-network pre-processing system 490 has been trained. A determination of all substrate within all slots (e.g., all 25 slots) is then output at block 498.

Figure 5A:
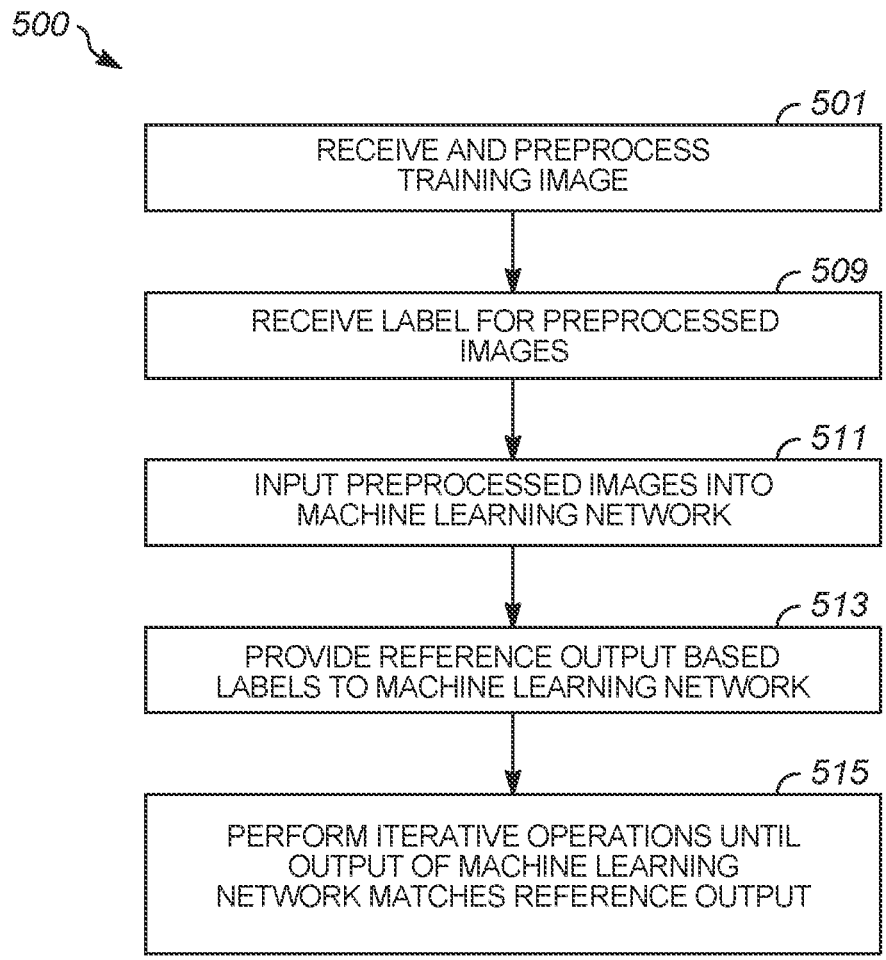
FIG. 5A shows an exemplary method for training the substrate-mapping system of FIG. 3, in accordance with various embodiments of the disclosed subject matter.

With reference now to FIG. 5A, an exemplary method 500 for training the substrate-mapping system of FIG. 3, in accordance with various embodiments of the disclosed subject matter, is shown. The exemplary method 500 of the training process may be performed multiple times with a set of training images. At operation 501, a training image may be received and pre-processed as described above. The training image may correspond to an image of the same or similar type of substrate classification encountered during a normal-operation mode. The training images may be selected based on the presence of certain types of substrate classification state (e.g., properly-loaded substrate, cross-loaded substrate, double-loaded substrate, or protruded substrate). The pre-processing may include a series of filtering operations (at least part of which are described above) to assist in a determination of a classification of substrates as described above.

At operation 509, a label (e.g., a slot number) related to the preprocessed image may be received. In embodiments, the labels may be generated by a manual process. At operation 511, the preprocessed images may be input into the machine-learning network (e.g., the machine-learning network 460), as described herein. At operation 513, a reference output based on the labels may be generated and provided to the machine-learning network.

At operation 515, the machine-learning network may perform iterative operations until the output of the machine-learning network matches or substantially matches the reference output based on a classification type for each of the labels. The labels may be associated with a known classification type (e.g., properly-loaded substrate, cross-loaded substrate, double-loaded substrate, or protruded substrate). Upon reading and understanding the disclosed subject matter, a person of ordinary skill in the art will recognize that more than one classification type may be applied, such as a cross-loaded substrate that protrudes from the substrate carrier or a cross-loaded substrate that is also double loaded.

The exemplary method 500 may be repeated for a set of training images to train the machine-learning network. The training images may include different classification types to train the machine-learning network to detect different types of substrates (e.g., elemental, compound, bonded substrates, etc., each combined with a different diameter and/or thickness) with the classification types. After the machine-learning network completes the training process, it can be used in normal-operation mode to detect classification types of substrates during, for example, a fabrication or metrology process.

Figure 5B:
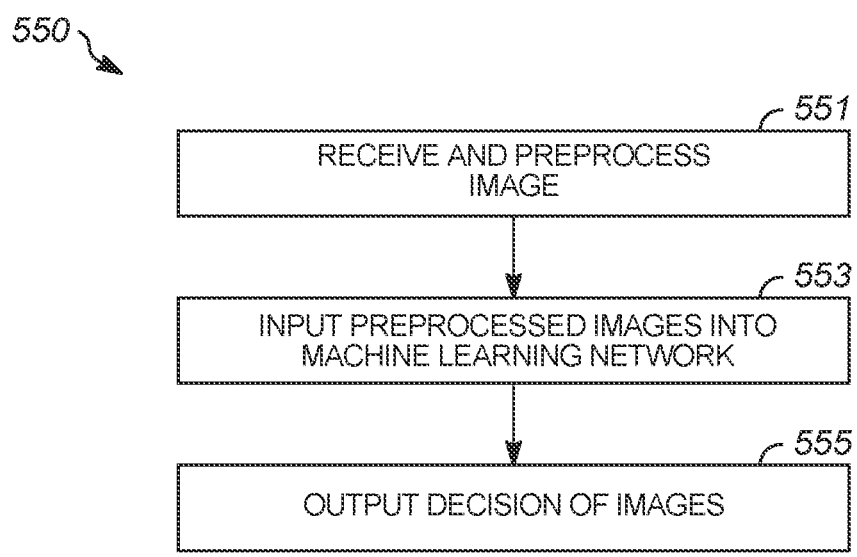
FIG. 5B shows an exemplary method for using the substrate-mapping system of FIG. 3 in a normal operation mode, in accordance with various embodiments of the disclosed subject matter.

FIG. 5B shows an exemplary method 550 for using the substrate-mapping system of FIG. 3 in a normal operation mode, in accordance with various embodiments of the disclosed subject matter. At operation 551, at least one image of the device under inspection may be received and pre-processed as described above. The image may be captured by the camera 303, as described above with reference to FIG. 3. The pre-processing may a number of filtering techniques, as described above.

At operation 553, the preprocessed images may be input into the machine-learning network, as described herein. At operation 555, the machine-learning network (e.g., the machine-learning network 460 of FIG. 4), based on its training, may perform operations to output a decision regarding each substrate classification state from the pre-processed images.

Figure 6:
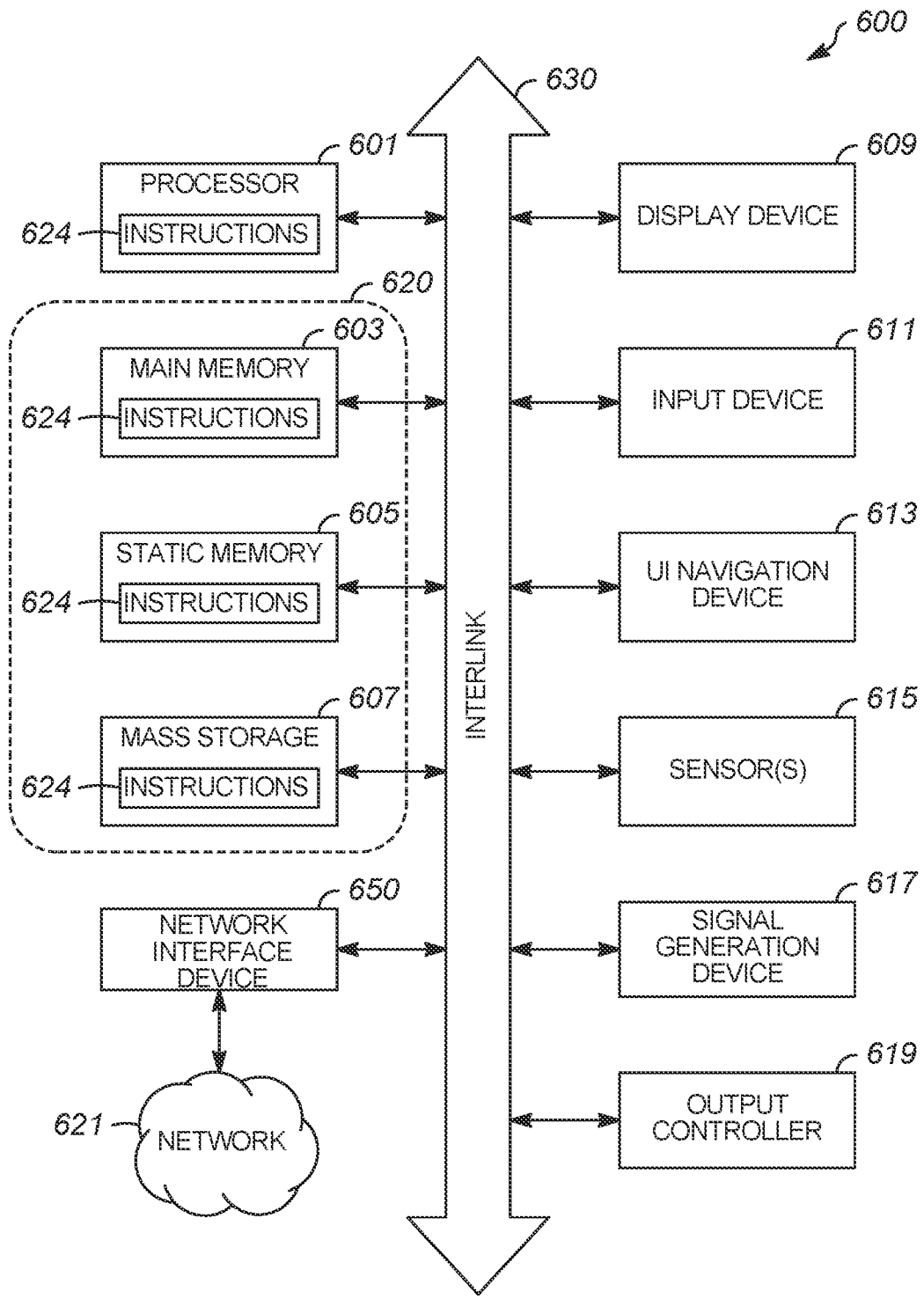
FIG. 6 shows a block diagram of an example comprising a machine upon which any one or more of the techniques (e.g., methodologies) discussed herein may be performed.

The techniques shown and described herein can be performed using a portion or an entirety of the substrate-mapping system 300, as shown in FIG. 3, or otherwise using a machine 600 as discussed below in relation to FIG. 6. FIG. 6 shows an exemplary block diagram comprising a machine 600 upon which any one or more of the techniques (e.g., methodologies) discussed herein may be performed. In various examples, the machine 600 may operate as a stand-alone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet device, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware comprising the circuitry may include variably connected physical components (e.g., execution units, transistors, simple circuits, etc.) including a computer-readable medium physically modified (e.g., magnetically, electrically, such as via a change in physical state or transformation of another physical characteristic, etc.) to encode instructions of the specific operation. In connecting the physical components, the underlying electrical properties of a hardware constituent may be changed, for example, from an insulating characteristic to a conductive characteristic or vice versa. The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine 600 (e.g., computer system) may include a hardware processor 602 (e.g., a central processing unit (CPU), a graphics processing unit (GPU), a hardware processor core, or any combination thereof), a main memory 604 and a static memory 606, some or all of which may communicate with each other via an interlink 630 (e.g., a bus). The machine 600 may further include a display device 609, an input device 611 (e.g., an alphanumeric keyboard), and a user interface (UI) navigation device 613 (e.g., a mouse). In an example, the display device 609, the input device 611, and the UI navigation device 613 may comprise at least portions of a touch screen display. The machine 600 may additionally include a storage device 620 (e.g., a drive unit), a signal generation device 617 (e.g., a speaker), a network interface device 650, and one or more sensors 615, such as a global positioning system (GPS) sensor, compass, accelerometer, or other sensor. The machine 600 may include an output controller 619, such as a serial controller or interface (e.g., a universal serial bus (USB)), a parallel controller or interface, or other wired or wireless (e.g., infrared (IR) controllers or interfaces, near field communication (NFC), etc., coupled to communicate or control one or more peripheral devices (e.g., a printer, a card reader, etc.).

The storage device 620 may include a machine readable medium on which is stored one or more sets of data structures or instructions 624 (e.g., software or firmware) embodying or utilized by any one or more of the techniques or functions described herein. The instructions 624 may also reside, completely or at least partially, within a main memory 603, within a static memory 605, within a mass storage device 607, or within the hardware-based processor

601 during execution thereof by the machine 600. In an example, one or any combination of the hardware-based processor 601, the main memory 603, the static memory 605, or the storage device 620 may constitute machine readable media.

While the machine readable medium is considered as a single medium, the term "machine readable medium" may include a single medium or multiple media (e.g., a centralized or distributed database, and/or associated caches and servers) configured to store the one or more instructions 624.

The term "machine readable medium" may include any medium that is capable of storing, encoding, or carrying instructions for execution by the machine 600 and that cause the machine 600 to perform any one or more of the techniques of the present disclosure, or that is capable of storing, encoding or carrying data structures used by or associated with such instructions. Non-limiting machine-readable medium examples may include solid-state memories, and optical and magnetic media. Accordingly, machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic or other phase-change or state-change memory circuits; magnetic disks, such as internal hard disks and removable disks; magneto-optical disks; and CD-ROM and DVD-ROM disks.

The instructions 624 may further be transmitted or received over a communications network 621 using a transmission medium via the network interface device 650 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., the Institute of Electrical and Electronics Engineers (IEEE) 802.22 family of standards known as Wi-Fi®, the IEEE 802.26 family of standards known as WiMax®), the IEEE 802.25.4 family of standards, peer-to-peer (P2P) networks, among others. In an example, the network interface device 650 may include one or more physical jacks (e.g., Ethernet, coaxial, or phone jacks) or one or more antennas to connect to the communications network 626. In an example, the network interface device 650 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 600, and includes digital or analog communications signals or other intangible medium to facilitate communication of such software.

As used herein, the term "or" may be construed in an inclusive or exclusive sense. Further, other embodiments will be understood by a person of ordinary skill in the art based upon reading and understanding the disclosure provided. Moreover, the person of ordinary skill in the art will readily understand that various combinations of the techniques and examples provided herein may all be applied in various combinations.

Throughout this specification, plural instances may implement components, operations, or structures described as a single instance. Although individual operations are illustrated and described as separate operations, one or more of the individual operations may be performed concurrently, and, unless otherwise stated, nothing requires that the operations necessarily be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter described herein.

Further, although not shown explicitly but understandable to a skilled artisan, each of the various arrangements, quantities, and number of elements may be varied (e.g., the number of cameras, lenses, and illumination sources used). Also, the various wavelengths are provided merely as a aid in understanding. Moreover, each of the examples shown and described herein is merely representative of one possible configuration and should not be taken as limiting the scope of the disclosure.

Although various embodiments are discussed separately, these separate embodiments are not intended to be considered as independent techniques or designs. As indicated above, each of the various portions may be inter-related and each may be used separately or in combination with other embodiments discussed herein. For example, although various embodiments of operations, systems, and processes have been described, these methods, operations, systems, and processes may be used either separately or in various combinations.

Consequently, many modifications and variations can be made, as will be apparent to a person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to ascertain quickly the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

The description provided herein includes illustrative examples, devices, and apparatuses that embody various aspects of the matter described in this document. In the description, for purposes of explanation, numerous specific details are set forth in order to provide an understanding of various embodiments of the matter discussed. It will be evident however, to those of ordinary skill in the art, that various embodiments of the disclosed subject matter may be practiced without these specific details. Further, well-known structures, materials, and techniques have not been shown in detail, so as not to obscure the various illustrated embodiments. As used herein, the terms "about," "approximately," and "substantially" may refer to values that are, for example, within +10% of a given value or range of values.

THE FOLLOWING NUMBERED EXAMPLES ARE SPECIFIC EMBODIMENTS OF THE DISCLOSED SUBJECT MATTER

Example 1: A method for classifying a state of a number of substrates within locations in a substrate carrier. The method includes detecting at least a portion of the substrates in the substrate carrier. The detecting includes capturing one or more images of the portion of the substrates and the locations proximate to the portion of the substrates, transferring the one or more images to a pre-trained deep-convolutional neural-network, classifying the state of the portion of the substrates within the locations within the substrate carrier from the images using the pre-trained deep-convolutional neural-network, and providing an automatic tagging of each of the plurality of locations within the substrate carrier that are proximate to the portion of the plurality of substrates.

Example 2: The method of Example 1, further comprising training the neural network to classify a state of the substrate locations.

Example 3: The method of either example 1 or Example 2, wherein the automatic tagging includes classifying each of the plurality of locations as at least one classification type selected from types including properly loaded, cross-slotted, double-loaded, protruded, and empty.

Example 4: The method of any one of the preceding Examples, further comprising identifying each of the portion of the plurality of substrates for at least one substrate characteristic including characteristics selected from substrate thickness, substrate bow, substrate warp, and substrate droop, wherein the at least one characteristic is provided to adjust a position of a robot end-effector with one or more of the plurality of substrates.

Example 5: The method of any one of the preceding Examples, wherein the classifying further comprises identifying a plurality of substrate types within the substrate carrier from the portion of the plurality of substrates.

Example 6: The method of any one of the preceding Examples, further comprising selecting a wavelength of a light source used in capturing the one or more images based on at least one of a reflection characteristic of the substrates within the substrate carrier, a transmission characteristic of the substrates within the substrate carrier, and a film or coating on the substrates.

Example 7: The method of claim 6, further comprising selecting an angle-of-incidence, a polarization state, and an intensity of radiation of the light source.

Example 8: The method of any one of the preceding Examples, further comprising scaling each of the one or more images into a trained convnet size.

Example 9: A substrate-mapping system includes a camera to collect one or more images of substrates and potential locations of substrates in a substrate carrier, and a data-collection and control system. The one or more images include a relationship of the substrates and locations of the substrates relative to a number of substrate slots in the substrate carrier. The data-collection and control system includes one or more hardware-based processors of a machine coupled to the camera and is arranged to transfer the one or more images to a deep-convolutional neural-network, classify a state of the portion of the imaged ones of the substrates within the locations of the substrate within the substrate carrier from the one or more images using the deep-convolutional neural-network, and provide an automatic tagging of each of the locations of the substrates within the substrate carrier that are proximate to the portion of the imaged ones of the substrates.

Example 10: The substrate-mapping system of Example 9, further comprising a light source to illuminate at least some of the substrates and the potential locations of the substrates in the substrate carrier.

Example 11: The substrate-mapping system of Example 10, wherein the light source is a broadband source.

Example 12: The substrate-mapping system of Example 10, wherein the light source is a monochromatic source.

Example 13: The substrate-mapping system of Example 10, wherein a wavelength of light emitted from the light source is selected based on at least one of a reflection characteristic of the substrates within the substrate carrier, a transmission characteristic of the substrates within the substrate carrier, and a film or coating on the substrates.

Example 14: The substrate-mapping system of Example 10, wherein one or more characteristics of the light source include selection of an angle-of-incidence, a polarization state, and an intensity of radiation.

Example 15: The substrate-mapping system of any one of Examples 9 through 14, wherein the automatic tagging includes classifying each of the plurality of locations as at least one classification type selected from types including properly loaded, cross-slotted, double-loaded, protruded, and empty.

Example 16: The substrate-mapping system of any one of Examples 9 through 15, wherein the data-collection and control system is further configured to: identify each of the imaged substrates for at least one substrate characteristic including characteristics selected from substrate thickness, substrate bow, substrate warp, and substrate droop; and transmit the at least one substrate characteristic to a transfer robot to adjust a locational position between an end-effector of the transfer robot and a selected one of the substrates due to one or more of the substrate characteristics.

Example 17: The substrate-mapping system of any one of Examples 9 through 16, further comprising characterizing a size of the substrate carrier.

Example 18: The substrate-mapping system of any one of Examples 9 through 17, wherein the system is initially trained in a training mode based on the one or more images to produce a pre-trained deep-convolutional neural-network, subsequent to substrate-mapping system being configured to be used in a in a normal-operation mode within a fabrication facility to detect a placement of substrates within substrate carriers within the fabrication facility based on the pre-trained deep-convolutional neural-network.

Example 19: The substrate-mapping system of any one of Examples 9 through 18, wherein the data-collection and control system is further configured to scale each of the one or more images into a trained convnet size.

Example 20: A computer-readable medium containing instructions that, when executed by a machine, cause the machine to perform operations including detecting at least a portion of the substrates in the substrate carrier. The detecting includes capturing one or more images of the portion of the substrates and the locations proximate to the portion of the substrates, transferring the one or more images to a pre-trained deep-convolutional neural-network, classifying the state of the portion of the substrates within the locations within the substrate carrier from the images using the pre-trained deep-convolutional neural-network, and providing an automatic tagging of each of the plurality of locations within the substrate carrier that are proximate to the portion of the plurality of substrates.

Example 21: The computer-readable medium of Example 20, further comprising training the neural network to classify a state of the substrate locations.

Example 22: The computer-readable medium of either Example 20 or Example 20, wherein the automatic tagging includes classifying each of the plurality of locations as at least one classification type selected from types including properly loaded, cross-slotted, double-loaded, protruded, and empty.

Example 23: The computer-readable medium of any one of the preceding Examples 20 through 22, further comprising identifying each of the portion of the plurality of substrates for at least one substrate characteristic including characteristics selected from substrate thickness, substrate bow, substrate warp, and substrate droop, wherein the at least one characteristic is provided to adjust a position of a robot end-effector with one or more of the plurality of substrates.

Example 24: The computer-readable medium of any one of the preceding Examples 20 through 23, wherein the classifying further comprises identifying a plurality of substrate types within the substrate carrier from the portion of the plurality of substrates.

Example 25: The computer-readable medium of any one of the preceding Examples 20 through 24, further comprising selecting a wavelength of a light source used in capturing the one or more images based on at least one of a reflection characteristic of the substrates within the substrate carrier, a transmission characteristic of the substrates within the substrate carrier, and a film or coating on the substrates.

Example 26: The computer-readable medium of Example 25, further comprising selecting an angle-of-incidence, a polarization state, and an intensity of radiation of the light source.

Example 27: The computer-readable medium of any one of the preceding Examples 20 through 26, further comprising scaling each of the one or more images into a trained convnet size.

What is claimed is:

1. A method for classifying a state of a plurality of substrates for a plurality of locations in a substrate carrier, the method comprising:
    detecting at least a portion of the plurality of substrates in the substrate carrier, the detecting including capturing one or more images of the portion of the plurality of substrates for the plurality of locations that is proximate to the portion of the plurality of substrates;
    sending the one or more images to a pre-trained deep-convolutional neural-network;
    classifying the state of the portion of the plurality of substrates for the plurality of locations within the substrate carrier from the one or more images using the pre-trained deep-convolutional neural-network; and
    using the state of the portion of the plurality of substrates to set how a substrate of the plurality of substrates within the substrate carrier is handled.

2. The method of claim 1, further comprising training the neural network to classify a state of the substrate locations.

3. The method of claim 1, wherein the state includes classifying each of the plurality of locations as at least one classification type selected from types including properly loaded, cross-slotted, double-loaded, protruded, and empty.

4. The method of claim 1, further comprising identifying each of the portion of the plurality of substrates for at least one substrate characteristic including characteristics selected from substrate thickness, substrate bow, substrate warp, and substrate droop, wherein the at least one characteristic is provided to adjust a position of a robot end-effector with one or more of the plurality of substrates.

5. The method of claim 1, wherein the classifying further comprises identifying a plurality of substrate types within the substrate carrier from the portion of the plurality of substrates.

6. The method of claim 1, further comprising selecting a wavelength of a light source used in capturing the one or more images based on at least one of a reflection characteristic of the substrates within the substrate carrier, a transmission characteristic of the substrates within the substrate carrier, and a film or coating on the substrates.

7. The method of claim 6, further comprising selecting an angle-of-incidence, a polarization state, and an intensity of radiation of the light source.

8. The method of claim 1, further comprising scaling each of the one or more images into a trained convnet size.

9. A substrate-mapping system, comprising:
    a camera to collect one or more images of a portion of a plurality of substrates for a plurality of locations of substrates in a substrate carrier, the one or more images including a relationship of the portion of the plurality substrates and the plurality of locations of the substrates relative to a plurality of substrate slots in the substrate carrier; and
    a data-collection and control system, including one or more hardware-based processors of a machine coupled to the camera, the data-collection and control system to
    send the one or more images to a deep-convolutional neural-network;
    classify a state of the portion of the plurality of substrates for the plurality of locations within the substrate carrier from the one or more images using the deep-convolutional neural-network; and
    using the state of the portion of the plurality of substrates to set how a substrate of the plurality of substrates within the substrate carrier is handled.

10. The substrate-mapping system of claim 9, further comprising a light source to illuminate at least some of the plurality of substrates and the plurality of locations of the substrates in the substrate carrier.

11. The substrate-mapping system of claim 10, wherein the light source is a broadband source.

12. The substrate-mapping system of claim 10, wherein the light source is a monochromatic source.

13. The substrate-mapping system of claim 10, wherein a wavelength of light emitted from the light source is selected based on at least one of a reflection characteristic of the substrates within the substrate carrier, a transmission characteristic of the substrates within the substrate carrier, and a film or coating on the substrates.

14. The substrate-mapping system of claim 10, wherein one or more characteristics of the light source include selection of an angle-of-incidence, a polarization state, and an intensity of radiation.

15. The substrate-mapping system of claim 9, wherein the state includes classifying each of the plurality of locations as at least one classification type selected from types including properly loaded, cross-slotted, double-loaded, protruded, and empty.

16. The substrate-mapping system of claim 9, wherein the data-collection and control system is further configured to:
- identify each of the imaged substrates for at least one substrate characteristic including characteristics selected from substrate thickness, substrate bow, substrate warp, and substrate droop; and
- transmit the at least one substrate characteristic to a transfer robot to adjust a locational position between an end-effector of the transfer robot and a selected one of the substrates due to one or more of the substrate characteristics.

17. The substrate-mapping system of claim 9, further comprising characterizing a size of the substrate carrier.

18. The substrate-mapping system of claim 9, wherein the system is initially trained in a training mode based on the one or more images to produce a pre-trained deep-convolutional neural-network, subsequent to substrate-mapping system being configured to be used in a in a normal-operation mode within a fabrication facility to detect a placement of substrates within substrate carriers within the fabrication facility based on the pre-trained deep-convolutional neural-network.

19. The substrate-mapping system of claim 9, wherein the data-collection and control system is further configured to scale each of the one or more images into a trained convnet size.

20. A non-transitory computer-readable medium containing instructions that, when executed by a machine, cause the machine to perform operations comprising:
- detecting at least a portion of a plurality of substrates in a substrate carrier, the detecting including capturing one or more images of the portion of the plurality of substrates for a plurality of locations that is proximate to the portion of the plurality of substrates;
- sending the one or more images to a pre-trained deep-convolutional neural-network;
- classifying the state of the portion of the plurality of substrates for the locations within the substrate carrier from the one or more images using the pre-trained deep-convolutional neural-network; and
- using the state of the portion of the plurality of substrates to set how a substrate of the plurality of substrates within the substrate carrier is handled.

* * * * *

UNITED STATES PATENT AND TRADEMARK OFFICE
CERTIFICATE OF CORRECTION

| | | |
|---|---|---|
| PATENT NO. | : 12,131,454 B2 | Page 1 of 1 |
| APPLICATION NO. | : 17/476195 | |
| DATED | : October 29, 2024 | |
| INVENTOR(S) | : Jason Paul Remillard, John D. Nevin, IV and Stephen W. Into | |

It is certified that error appears in the above-identified patent and that said Letters Patent is hereby corrected as shown below:

In the Specification

Column number 8 Line no 59-61, "for example, the CPU 311 working in conjunction with the CPU 319 for faster processing" should read as, "for example, the CPU 311 working in conjunction with the GPU 319 for faster processing".

Signed and Sealed this
Eighteenth Day of March, 2025

Coke Morgan Stewart
*Acting Director of the United States Patent and Trademark Office*